US006675326B1

United States Patent
Yoshizaki

(10) Patent No.: US 6,675,326 B1
(45) Date of Patent: Jan. 6, 2004

(54) METHOD AND APPARATUS FOR DETECTING A DATA RECEIVING ERROR

(75) Inventor: Shoichi Yoshizaki, Sunnyvale, CA (US)

(73) Assignee: Matsushita Electric Industrial Co., Ltd., Osaka (JP)

( * ) Notice: Subject to any disclaimer, the term of this patent is extended or adjusted under 35 U.S.C. 154(b) by 698 days.

(21) Appl. No.: 09/613,899

(22) Filed: Jul. 11, 2000

(51) Int. Cl.[7] .................................................. G06F 11/00
(52) U.S. Cl. ........................ 714/48; 375/373; 375/375
(58) Field of Search .................... 714/48, 814; 375/373, 375/374, 375, 376

(56) References Cited

U.S. PATENT DOCUMENTS 6,310,653 B1 * 10/2001 Malcolm et al. ............ 348/537
6,462,726 B1 * 10/2002 Hamada et al. ............... 345/98

* cited by examiner

Primary Examiner—Scott Baderman
(74) Attorney, Agent, or Firm—McDermott, Will & Emery

(57) ABSTRACT

A receiver unit for receiving asynchronous digital data signals. The receiver includes a clock recovery unit operative for receiving the asynchronous serial data signal and for producing a clock signal corresponding to the asynchronous serial data signal; a sampling gate operative for receiving the asynchronous serial data signal and the clock signal as input signals, and for producing a sampled data signal, where the sampled data signal corresponds to the asynchronous serial data signal and is synchronized with the clock signal; a first counter for receiving the asynchronous serial data signal and operative for counting each pulse contained in the asynchronous serial data signal; a second counter for receiving the sampled data signal and for counting each pulse contained in the sampled data signal; a subtractor circuit for subtracting the value of the second counter from the value of the first counter, and for generating a result value; and an error indication circuit for monitoring the result value of the subtractor and for generating an error signal when the result value exceeds a predetermined value.

15 Claims, 5 Drawing Sheets

METHOD AND APPARATUS FOR DETECTING A DATA RECEIVING ERROR

FIELD OF THE INVENTION

The present invention relates to systems and methods for the recovery of asynchronous digital data by a receiver, and more particularly to an apparatus and method for detecting and identifying an intermittent loss of data in the recovered data signal.

BACKGROUND TO THE INVENTION

In digital data transmission systems operating in an asynchronous data transfer mode, digital data is output by a transmission unit as an asynchronous serial data signal, without a clock signal embedded therein. Upon reception of the asynchronous serial data signal, the receiver must function to recover the data transmitted by the transmission unit, and to generate a clock signal corresponding to the received data. Importantly, both the generated clock signal and the data must be synchronous (i.e., phase aligned) with one another so as to allow the receiver to properly process the received data.

FIG. 1 illustrates an example of a prior art clock and data regeneration portion of a receiver circuit. As shown, the receiver 10 has a cable 8 coupled to the input thereof. Cable 8 functions to couple the asynchronous data signal to the receiver. The clock and data regeneration portion 12 of the receiver comprises a clock recovery unit 13 and a sampling gate 14, which, for example, can comprise a flip-flop. In operation, the incoming serial data signal is coupled to the clock recovery unit 13, which functions to reproduce a clock signal corresponding to the received data signal. The output of the clock recovery unit 13 is coupled to a clock input of the sampling gate 14, and is utilized to clock the sampling gate 14. As such, the output of the sampling flip-flop 14 and the clock recovery unit 13 represent the incoming data signal and corresponding clock signal phase aligned with one another. These two signals, which represent the output of the clock and data regeneration portion 12 of the receiver, are coupled to the main portion of the receiver for processing.

FIG. 2 illustrates an example of known clock recovery unit 16. As shown, the clock recovery unit comprises a phase detector 17, a charge pump 18, a low pass filter 19 and a voltage controller oscillator ("VCO") 20 all coupled in series. In operation, the phase detector 17 receives both the incoming serial data signal and the output of the VCO 20 as input signals, and detects the phase difference between these two signals. The phase difference output by the phase detector 17 is then utilized to control the voltage level output by the charge pump 18 so as to adjust the frequency of the signal output by the VCO 20 to eliminate the phase difference between the VCO 20 and the incoming serial data signal. Accordingly, the output of the VCO 20 is continuously tracking the incoming serial data signal and represents the recovered clock signal.

While known receiver systems can identify a disruption in incoming data, for example, resulting from a break in the transmission line, currently, there is no known method for identifying an error of a sole bit of data, with regard to either the generated clock signal or the sampled data signal, in an efficient and cost effective manner. In other words, there is no known system for identifying that a given sampled signal (i.e., data and clock) is in error. Accordingly, there is exists a need for an error detection system that can readily identify when an error has occurred in the regeneration of the data signal or the corresponding clock signal so that the system does not process erroneous data. Furthermore, it is necessary that the system be simple and cost effective so that it is practical to include the error detection system in today's generation of the asynchronous data receivers.

SUMMARY OF THE INVENTION

In an effort to solve the aforementioned needs, it is an object of the present invention to provide a simple, cost effective design that provides for error detection of the received data signal and the corresponding clock signal.

More specifically, the present invention relates to an error detection circuit comprising a first counter for receiving a data signal, where the first counter is operative for counting each pulse contained in the data signal; a second counter for receiving a sampled data signal, where the second counter is operative for counting each pulse contained in the sampled data signal; a subtractor circuit for subtracting the value of the second counter from the value of the first counter, and for generating a result value; and an error indication circuit for monitoring the result value of the subtractor circuit and for generating an error signal when the result value exceeds a predetermined value.

The present invention further relates to a receiver operative for receiving an asynchronous digital data signal. The receiver comprises a clock recovery unit operative for receiving the asynchronous serial data signal and for producing a clock signal corresponding to the asynchronous serial data signal; a sampling gate operative for receiving the asynchronous serial data signal and the clock signal as input signals, and for producing a sampled data signal, where the sampled data signal corresponds to the asynchronous serial data signal and is synchronized with the clock signal; a first counter for receiving the asynchronous serial data signal and operative for counting each pulse contained in the asynchronous serial data signal; a second counter for receiving the sampled data signal and for counting each pulse contained in the sampled data signal; a subtractor circuit for subtracting the value of the second counter from the value of the first counter, and for generating a result value; and an error indication circuit for monitoring the result value of the subtractor and for generating an error signal when the result value exceeds a predetermined value.

As described in further detail below, the present invention provides significant advantages over the prior art. Most importantly, the error detection system of the present invention provides a simple and cost efficient method of identifying if even a sole bit of the received data and the corresponding clock signal are in error. Thus, the system provides for improved reliability in a practical manner, which can be readily implemented in asynchronous serial data receivers.

Additional advantages of the present invention will become apparent to those skilled in the art from the following detailed description of exemplary embodiments of the present invention.

The invention itself, together with further objects and advantages, can be better understood by reference to the following detailed description and the accompanying drawings.

DETAILED DESCRIPTION OF THE INVENTION

Figure 1:
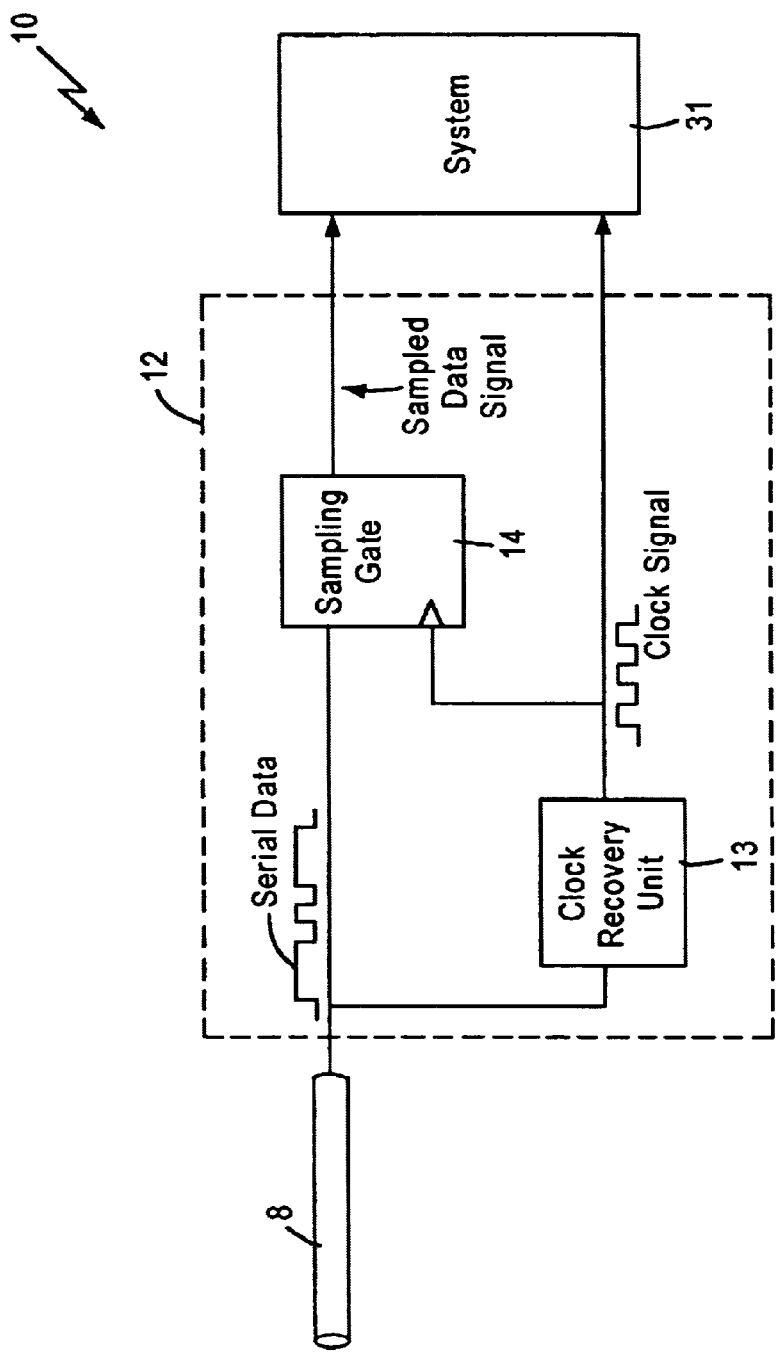
FIG. 1 illustrates an example of a prior art clock and data regeneration portion of a receiver.
Figure 2:
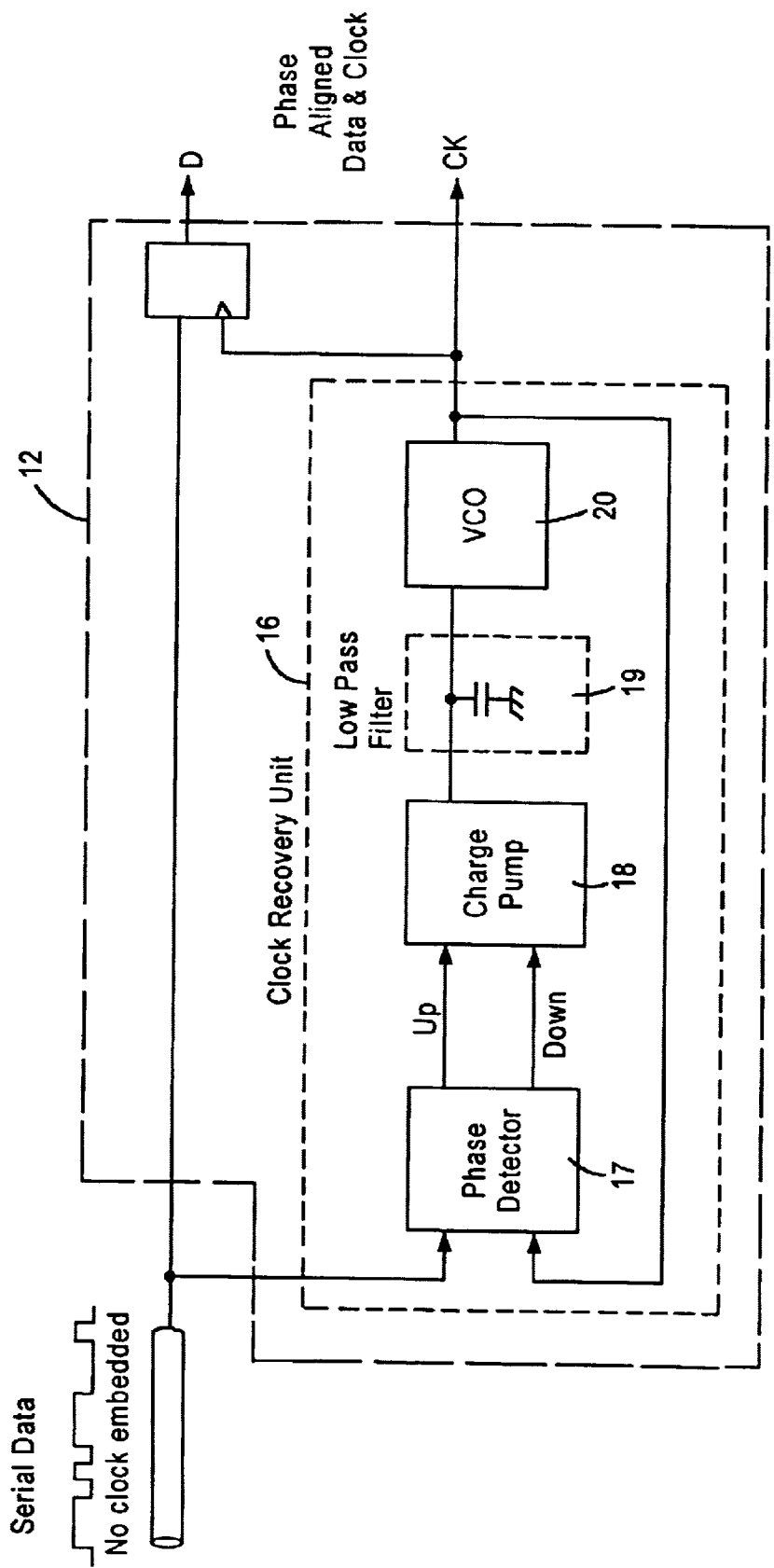
FIG. 2 illustrates an example of a prior art clock recovery unit.
Figure 3:
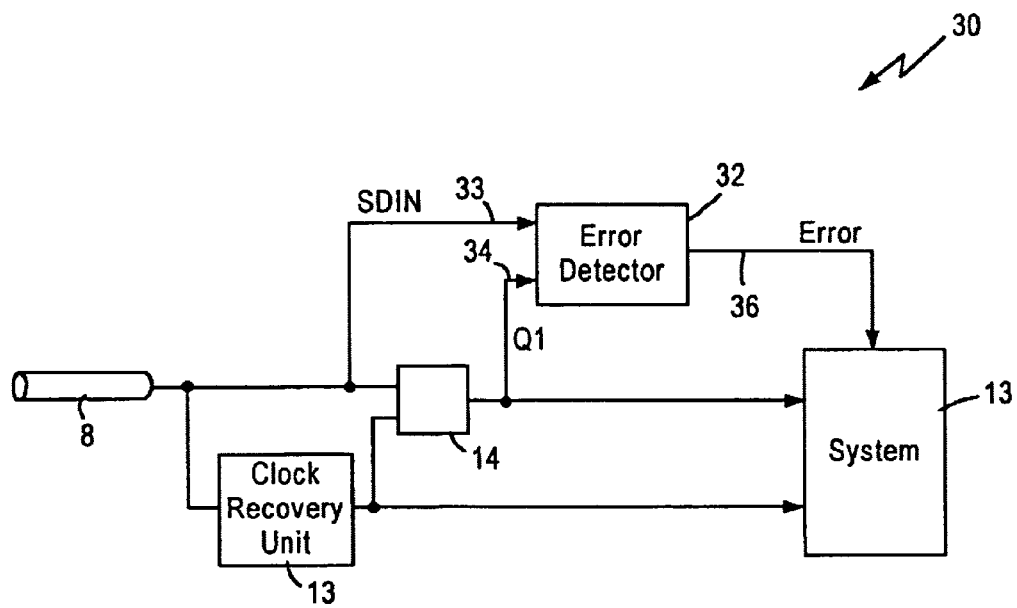
FIG. 3 illustrates an exemplary embodiment of the error detector of the present invention disposed within a receiver.

FIG. 3 illustrates an exemplary embodiment of the error detection system of the present invention. As shown, similar to the receiver described above with regard to FIG. 1, the receiver 30 receives an incoming serial data signal from cable 8 and comprises a clock recovery unit 13 and a sampling gate 14. As stated above, the output of the sampling gate 14 is the sampled data signal Q1 (i.e., regenerated data signal) and the output of the clock recovery unit 13 is the clock signal corresponding to the data signal Q1. It is noted that the foregoing components illustrated in FIG. 3 are the same as those illustrated in FIG. 1, and therefore the same reference numbers have been utilized to designate the respective components.

The receiver 30 further comprises an error detector 32 having two inputs 33 and 34. As shown, one input line 33 of the error detector 32 receives the incoming serial data signal directly from the cable 8, and the other input line 34 receives the sampled data signal Q1 output by the sampling gate 14. The error detector 32 further comprises an output 36 which is coupled to a data processing portion 31 of the receiver 30. The error detector 32 functions to output an error signal when an error is detected between the incoming serial data signal and the sampled data signal, and to notify the data processing portion 31 of the receiver 30 of the error such that the erroneously sampled data can be marked as such, and processed accordingly. The operation of an exemplary embodiment of the error detector 32 will now be described with reference to FIGS. 4 and 5.

Figure 4:
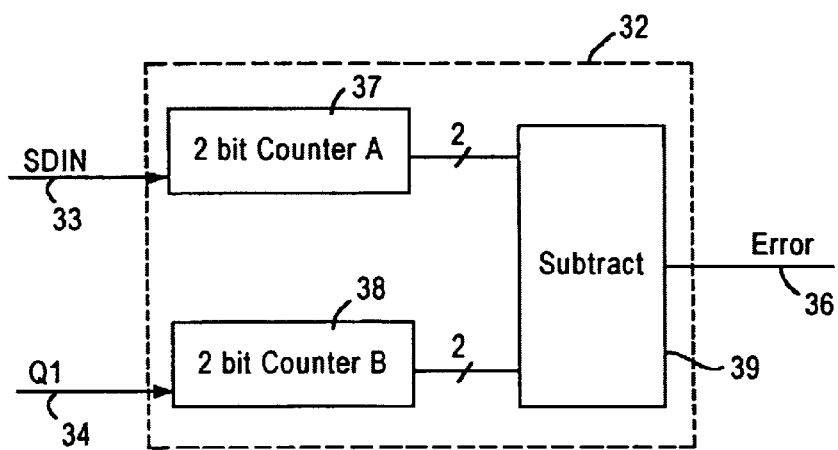
FIG. 4 illustrates an exemplary embodiment of the error detector illustrated in FIG. 3.
Figure 5:
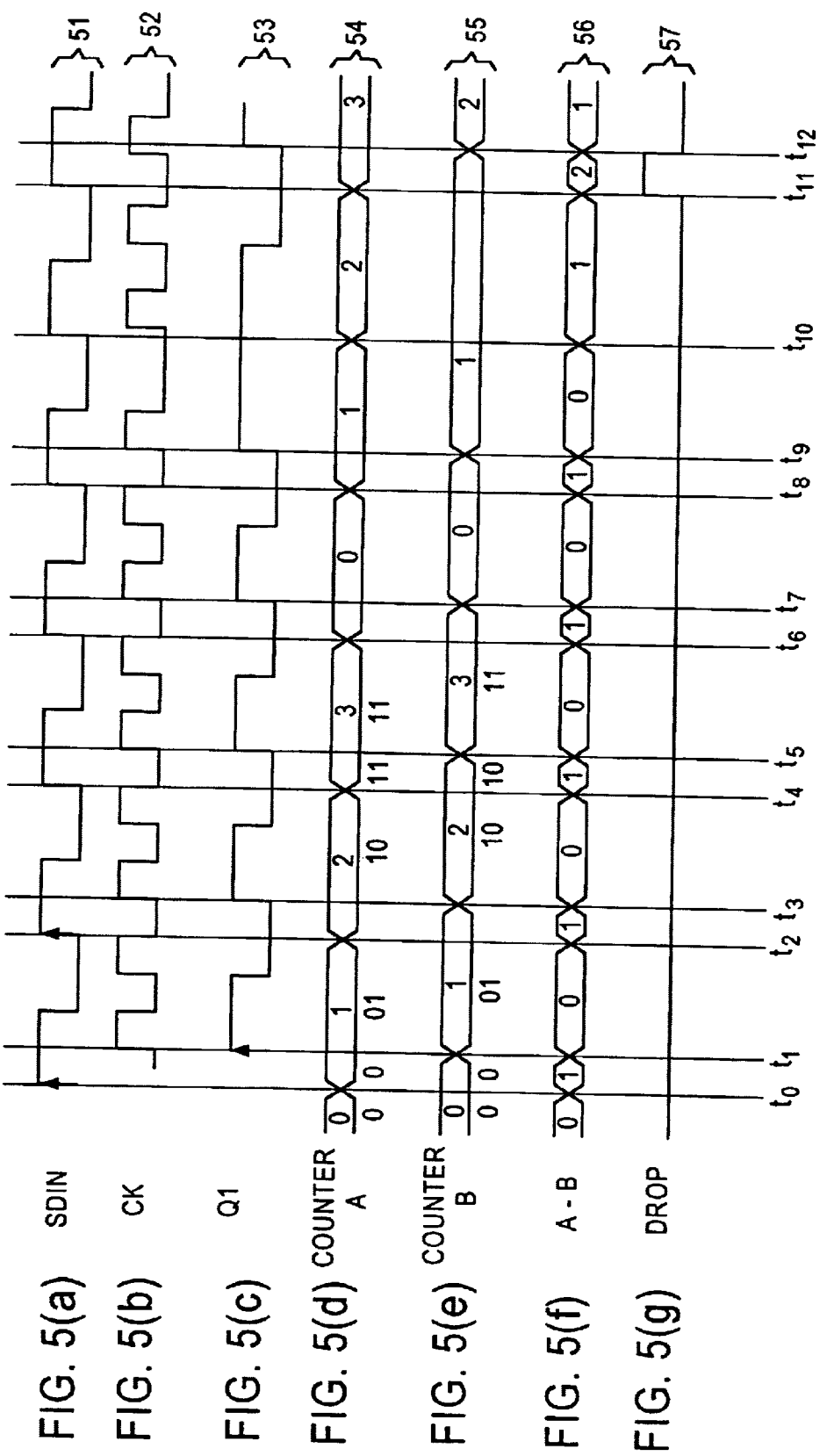
FIGS. 5(a)–5(g) are exemplary timing diagrams illustrating the operation of the error detection system of the present invention.

FIG. 4 illustrates an exemplary block diagram of the error detector 32 of the present invention. As shown, the error detector 32 comprises a first two-bit counter 37, a second two-bit counter 38 and a subtractor 39. The first two-bit counter 37 receives incoming serial data from cable 8 and functions to count each pulse of the incoming serial data signal. Specifically, as is known, the first two-bit counter 37 will count from 0 to 3 and then reset to zero and begin counting again. In the current embodiment, the first two-bit counter 37 increments upon receiving the rising edge of each pulse of the incoming serial data signal. Similarly, the second two-bit counter 38 receives the sampled data signal Q1 from sampling gate 14, and functions to count each pulse of sampled data. As with the first two-bit counter 37, the second two-bit counter 38 will count from 0 to 3 and then reset to zero and begin counting again. In the current embodiment, the second two-bit counter 38 also increments upon receiving the rising edge of each pulse of the sampled data signal Q1. It is noted that is also possible to have the counters 37, 38 increment on the falling edge of the respective pulses.

The output of each two-bit counter 37, 38 is coupled to a subtactor 39 which functions to subtract the value of the second two-bit counter 38 from the value of first two-bit counter 37 and output an error signal if the result is anything other than a "0" or a "1". As explained in detail below, any result of the subtractor 39 other than a "0" or "1" indicates that a sampling error or mis-sample has occurred. In such an instance, the error signal is generated by the error detector and forwarded to the processing portion 31 of the receiver 30 such that the mis-sampled data can be appropriately marked and processed.

It is noted that the operation of the novel error detector 32 of the present invention is premised on the fact that the sampled data signal Q1 must inherently track the incoming serial data signal if the data is being sampled correctly. Thus, by continually monitoring the difference between the sampled data signal Q1 and the incoming serial data signal, it is possible to determine if the sampled data signal Q1 is diverging from the incoming serial data signal, and in the event of such divergence, to produce an error signal indicating that an error has occurred. As noted above, in the current embodiment, if the difference between the sampled data signal Q1 and the incoming data signal is greater than "1" a mis-sample (i.e., sampling error) has occurred and an error signal is produced by the error detector 32.

FIGS. 5(a)–5(g) are timing diagrams illustrating the operation of the error detector 32 of the present invention. Referring to FIG. 5(a), an exemplary incoming data signal is represented by waveform 51. As set forth above, the incoming serial data signal is coupled to the clock recovery unit 13. The output of the clock recovery unit 13, which is the clock signal corresponding to the incoming data signal, is represented by waveform 52 as shown in FIG. 5(b). The generated clock signal 52 and the incoming data signal 51 are coupled to the sampling gate 14 to produce sampled data signal Q1, which is represented by waveform 53 as shown in FIG. 5(c).

As shown in FIG. 5(d), the first two-bit counter 37, which receives the incoming data signal 51 as an input, increments upon receiving each rising pulse edge of the incoming serial data signal. The first two-bit counter 37 counts to three and then returns to zero and begins counting again. This process is repeated continuously during operation of the error detector 32. Similarly, as shown in FIG. 5(e), the second first two-bit counter 38, which receives the sampled data signal 53 as an input, increments upon receiving each rising pulse edge of the sampled data signal 53. The second two-bit counter 38 also counts to three and then returns to zero and begins counting again.

FIG. 5(e) represents the result of the subtractor 39, which in the present embodiment continuously computes the difference between the incoming data signal 51 and the sampled data signal 53. In other words, after each transition of either the incoming serial data signal 51 or the sampled data signal 53, a difference value 56 is computed by the subtractor 39. As shown in the exemplary waveform of FIG. 5(e), at time $t_0$ the first pulse of the incoming data signal 51 is received and the first two-bit counter 37 increments to "1". At this time, the output of the subtractor 39 also becomes "1" as the sampled data signal 53 has yet to become a logic "1". Thus, the second two-bit counter 38 remains at "0". At time $t_1$, the sampled data signal 53 goes high (as it is tracking the incoming serial data signal) and the second two-bit counter 38.increments to "1". At this time, the output of the subtractor 39 goes to "0", as the first two-bit counter 37 and the second two-bit counter 38 have the same value of "1". This process is repeated at times $t_2$–$t_3$; $t_4$–$t_5$; $t_6$–$t_7$ and $t_8$–$t_9$, as each counter 37, 38 increments to a high value of 3 and then returns to 0. As stated, this process is continually repeated during system operation.

With regard to detecting an error, referring to FIGS. 5(a)–5(g), at time $t_{10}$ the incoming serial data signal 51 transitions to a logic "1" causing the first two-bit counter 37 to increment to "2". However, as shown in FIG. 5(b), the clock recovery unit 13 incorrectly fails to generate a second clock pulse between time $t_9$ and $t_{10}$. As a result, the sampled data signal 53 incorrectly fails to transition low and remains logic "1" as shown in FIG. 5(c). As such, the second two-bit counter 38 maintains a value of "1". When the next input pulse of the incoming serial data signal 51 is received at time $t_{11}$, the first two-bit counter 37 increments to "3". However, at this time, the second two-bit counter 38 has a value of "1", and therefore the subtractor 39 outputs a difference value of "2" at time $t_{11}$. As the value of "2" exceeds the predetermined acceptable range (i.e., "0" or "1"), an error signal 57 is generated at time $t_{11}$, as shown in FIG. 5(g). The error signal 57 indicates that the sampled data signal 53 has mis-sampled the incoming data signal 51. The error signal 57 is coupled to the data processing portion 31 of the receiver 30 such that the mis-sampled data can be recorded and treated in the appropriate manner.

FIGS. 5(a)–5(g) also illustrate the ability of the system to recover from the mis-sampling error, and terminate the error signal 57. More specifically, during time $t_{10}$–$t_{11}$, the clock signal 52 is once again generated correctly. As such, at time $t_{12}$, the sampled data signal 53 transitions high, which causes the second two-bit counter 38 to increment to a value of 2. As the first two-bit counter 37 remains at a value of "3" at time $t_{12}$, the difference value output by the subtractor 39 becomes a value of "1" at time $t_{12}$. Thus, because a value of "1" represents an acceptable divergence, the error signal 57 is turned off, and the sampled data 53 is accepted as an accurate representation of the incoming serial data signal 51. As is noted above, in accordance with the novel error detection scheme of the present invention, the only time an error occurs is when the difference value between the first two-bit counter 37 and the second two-bit counter 38 exceeds a value of "1".

Figure 6:
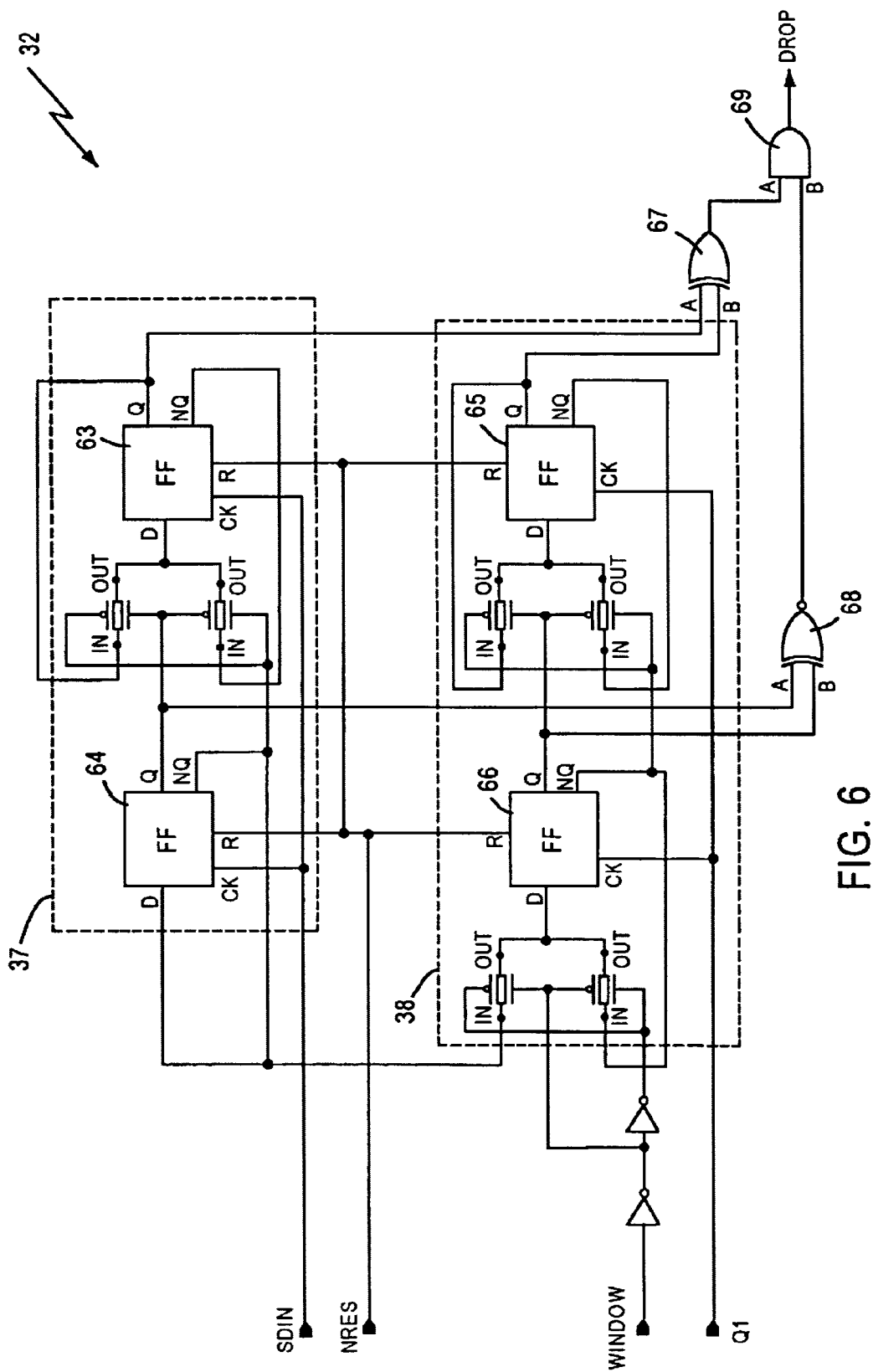
FIG. 6 is an exemplary schematic diagram of the error detector of FIG. 4.

FIG. 6 illustrates an exemplary embodiment of an actual implementation of the error detector 32 of the present invention. As shown, the error detector 32 comprises a first two-bit counter 37 having a first d flip-flop 63 and a second d flip-flop 64. The first d flip-flop 63 represents the most significant bit (MSB) of the two-bit counter 37. The second d flip-flop 64 represents the least significant bit (LSB) of the two-bit counter 37. As stated above, upon receipt of each leading edge of the incoming serial data signal 51, the two-bit counter 37 increments by "1". As such, the values output by the first d flip-flop 63 (MSB) and the second d flip-flop 64 (LSB) are respectively as follows: counter value "0"—MSB=0, LSB=0; counter value "1"—MSB=0, LSB=1; counter value "2"—MSB=1, LSB=0; and counter value "3"—MSB=1, LSB=1. The error detector 32 further comprises a second two-bit counter 38 also having a first d flip-flop 65 and a second d flip flop 66. The second two bit counter 38 is identical to the first two-bit counter 37 with the exception that it counts the rising edges of the sampled data signal 53.

The error detector 32 further comprises a subtractor and an error signal generator, which is formed by the combination of an exclusive OR gate 67, an exclusive NOR gate 68 and an AND gate 69. As shown, the exclusive NOR gate 68 receives the LSBs of both the first and second two-bit counters 37, 38 as input signals. The exclusive OR gate 67 receives the MSBs of both the first and second two-bit counters 37, 38 as input signals. The output of the exclusive OR gate 67 and the output of the exclusive NOR gate 68 are input signals to the AND gate 69.

In operation, the exclusive NOR gate 68 will produce a logic "1" only when the LSB of the first two-bit counter 37 is the same as the LSB of the second two-bit counter 38. The exclusive OR gate 67 will produce a logic "1" only when the MSB of the first two-bit counter 37 differs from the MSB of the second two-bit counter 38. Thus, the output of the AND gate 69 will only be a logic "1" when the LSB of the first two-bit counter 37 is the same as the LSB of the second two-bit counter 38, and the MSB of the first two-bit counter 37 differs from the MSB of the second two-bit counter 38.

However, in accordance with the novel error detection scheme utilizing the two-bit counters, whenever the difference between the value of the first two-bit counter 37 and the value of the second two-bit counter 38 exceeds the value of "1", which indicates a sampling error has occurred and an error signal should be generated, the value of the MSB of the first two-bit counter 37 and the second two-bit counter 38 must be different, and the value of the LSB of the first two-bit counter 37 and the second two-bit counter 38 must be equal. For example, assuming the first two-bit counter has a value of "2" and the second two-bit counter has a value of "0". The MSB and LSB of the first two-bit counter are "1" and "0" respectively, while the MSB and the LSB of the second two-bit counter are "0" and "0", respectively. It is readily shown that the foregoing is true for any difference greater than "1".

Accordingly, as is clear from the foregoing, only when both the output of the exclusive OR gate 67 and the exclusive NOR gate 68 are a logic high is the difference between the values of the first and second counters 37, 38 greater than "1" As such, as the output of the AND gate 69 is only high when the output of the exclusive OR gate 67 and the exclusive NOR gate 68 are high, the output of the AND gate 69 represents the error signal 57. Specifically, a mis-sampling or sampling error has occurred whenever the output of the AND gate 69 is a logic "1".

While specific details embodiments of the error detection system of the present have been disclosed herein, it is also clear that other variations are possible. For example, it would be understood that an alternative embodiment utilizing other than two-bit counters is possible. In addition, it is possible to provide alternative embodiments for computing the difference value of the first and second counters.

As described above, the error detector system of the present invention provides significant advantages over the prior art. Most importantly, the error detection system of the present invention provides a simple and cost efficient method of identifying if even a sole bit of the sampled data signal and the corresponding clock signal are in error. Thus, the system provides for improved reliability in a practical manner, which can be readily implemented in asynchronous serial data receivers.

Although certain specific embodiments of the present invention have been disclosed, it is noted that the present invention may be embodied in other forms without departing from the spirit or essential characteristics thereof. The present embodiments are therefor to be considered in all respects as illustrative and not restrictive, the scope of the invention being indicated by the appended claims, and all changes that come within the meaning and range of equivalency of the claims are therefore intended to be embraced therein.

I claim:

1. An error detection circuit comprising:

a first counter for receiving a data signal, said first counter operative for counting each pulse contained in said data signal;

a second counter for receiving a sampled data signal, said second counter operative for counting each pulse contained in said sampled data signal;

a subtractor circuit for subtracting the value of said second counter from the value of said first counter, and generating a result value; and an error indication circuit for monitoring the result value of the subtractor and for generating an error signal when said result value exceeds a predetermined value.

2. The error detection circuit of claim 1, wherein said data signal is an asynchronous serial data signal.

3. The error detection circuit of claim 2, wherein said sampled data signal is derived from said asynchronous serial data signal.

4. The error detection circuit of claim 1, wherein said first counter comprises a two-bit counter, and said second counter comprises a two-bit counter.

5. The error detection circuit of claim 1, wherein said predetermined value equals one.

6. The error detection circuit of claim 4, wherein said subtractor circuit and 'said error indication circuit are formed from the combination of circuit comprising:

a. an exclusive OR gate which receives the most significant bit of the first counter and the most significant bit of the second counter as input signals;

an exclusive NOR gate which receives the least significant bit of the first counter and the least significant bit of the second counter as input signals; and an AND gate which receives an output of said exclusive OR gate and an output of said exclusive NOR gate as input signals.

7. A receiver operative for receiving an asynchronous data signal, said receiver comprising:

a clock recovery unit operative for receiving said asynchronous data signal and for producing a clock signal corresponding to said asynchronous data signal;

a sampling gate operative for receiving said asynchronous data signal and said clock signal as input signals, and for producing a sampled data signal, said sampled data signal corresponding to said asynchronous data signal and synchronized with said clock signal;

a first counter for receiving said asynchronous data signal, said first counter operative for counting each pulse contained in said asynchronous data signal;

a second counter for receiving a sampled data signal, said second counter operative for counting each pulse contained in said sampled data signal;

a subtractor circuit for subtracting the value of said second counter from the value of said first counter, and generating a result value; and an error indication circuit for monitoring the result value of the subtractor and for generating an error signal when said result value exceeds a predetermined value.

8. The error detection circuit of claim 7, wherein said first counter comprises a two-bit counter, and said second counter comprises a two-bit counter.

9. The error detection circuit of claim 7, wherein said predetermined value equals one.

10. The error detection circuit of claim 8, wherein said subtractor circuit and said error indication circuit are formed from the combination of circuits comprising:

an exclusive OR gate which receives the most significant bit of the first counter and the most significant bit of the second counter as input signals;

an exclusive NOR gate which receives the least significant bit of the first counter and the least significant bit of the second counter as input signals; and an AND gate which receives an output of said exclusive OR gate and an output of said exclusive NOR gate as input signals.

11. A method of detecting a sampling error, said method comprising the steps of:

inputting a serial data signal to a first counter, said first counter operative for counting each pulse contained in said data signal;

inputting a sampled data signal into a second counter, said second counter operative for counting each pulse contained in said sampled data signal;

subtracting the value of said second counter from the value of said first counter, and generating a result value; and generating an error signal when said result value exceeds a predetermined value.

12. The method of detecting a sampling error of claim 11, wherein said serial data signal is an asynchronous serial data signal.

13. The method of detecting a sampling error of claim 12, further comprising deriving said sampled data signal from said asynchronous serial data signal.

14. The method of detecting a sampling error of claim 11, wherein said first counter comprises a two-bit counter, and said second counter comprises a two-bit counter.

15. The method of detecting a sampling error of claim 11, wherein said predetermined value equals one.

* * * * *